(12) United States Patent
Blodgett (10) Patent No.: US 6,549,479 B2
(45) Date of Patent: Apr. 15, 2003

(54) MEMORY DEVICE AND METHOD HAVING REDUCED-POWER SELF-REFRESH MODE

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/895,660

(22) Filed: Jun. 29, 2001

(65) Prior Publication Data

US 2003/0033473 A1 Feb. 13, 2003

(51) Int. Cl.[7] .............................................. G11C 7/00
(52) U.S. Cl. ................................ 365/222; 365/230.06
(58) Field of Search ........................... 365/222, 230.06, 365/223

(56) References Cited

U.S. PATENT DOCUMENTS

| | | | | |
|---|---|---|---|---|
| 5,392,251 A | * | 2/1995 | Manning | 365/222 |
| 5,602,999 A | | 2/1997 | Hyatt | 395/401 |
| 5,630,086 A | | 5/1997 | Marietta et al. | 395/405 |
| 5,778,415 A | | 7/1998 | Marietta et al. | 711/5 |
| 5,781,784 A | | 7/1998 | McKinley | 395/750.03 |
| 5,831,986 A | | 11/1998 | Sachdev | 371/21.2 |
| 5,959,925 A | * | 9/1999 | Tatsumi | 365/222 |
| 5,960,468 A | | 9/1999 | Paluch | 711/219 |
| 5,987,574 A | | 11/1999 | Paluch | 711/158 |
| 6,108,762 A | | 8/2000 | Law et al. | 711/217 |
| 6,141,279 A | * | 10/2000 | Hur et al. | 365/222 |
| 6,166,980 A | * | 12/2000 | Chun | 365/222 |
| 6,295,231 B1 | | 9/2001 | Toda et al. | 365/189.01 |
| 6,452,859 B1 | | 9/2002 | Shimano et al. | 365/230.06 |

* cited by examiner

Primary Examiner—Tan T. Nguyen
(74) Attorney, Agent, or Firm—Dorsey & Whitney, LLP (57) ABSTRACT

A dynamic random access memory device uses a gray code counter to generate addresses in a self-refresh operating mode so that only one bit of a row address generated by the counter changes state from one refresh cycle to the next. The row addresses are applied to a row address pre-decoder that coupled pre-decoded row address signals to a memory array in the memory device. The row address pre-decoder is operable to continuously couple at least some of the pre-decoded row address signals to the array from one refresh cycle to the next. As a result, only one a plurality of signal lines coupling the pre-decoded row address signals to the array must change state from one refresh cycle to the next, thereby minimizing the power consumed during the self-refresh mode.

51 Claims, 7 Drawing Sheets

| | RD-E | | RD-E | | RD-E | | RD-E | |
|---|---|---|---|---|---|---|---|---|
| SA | *300* | SA | ... *300* | SA | *300* | SA | *300* | SA |
| | RD-O | | RD-O | | RD-O | | RD-O | |
| SA | *300* | SA | *300* | SA | *300* | SA | *300* | SA |
| | RD-E | | RD-E | | RD-E | | RD-E | |
| SA | *300* | SA | *300* | SA | *300* | SA | *300* | SA |
| | RD-O | | RD-O | | RD-O | | RD-O | |

MEMORY DEVICE AND METHOD HAVING REDUCED-POWER SELF-REFRESH MODE

TECHNICAL FIELD

This invention relates to dynamic random access memory ("DRAM") devices, and more particularly to refreshing the memory cells of a DRAM in a manner that minimizes the power consumed by the DRAM during a self-refresh mode of operation.

BACKGROUND OF THE INVENTION

Figure 1:
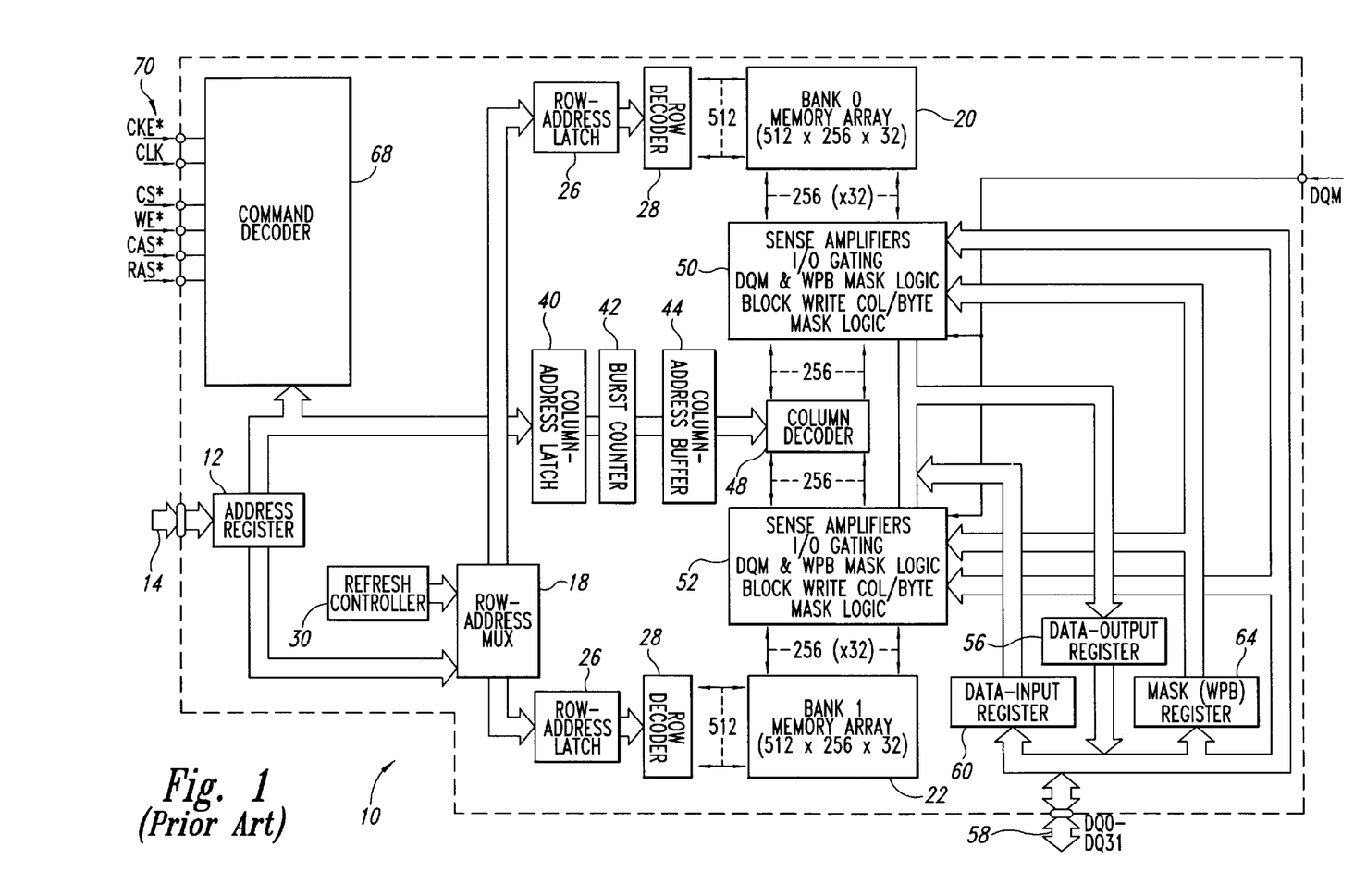
FIG. 1 is block diagram of the conventional memory device that can utilize a refresh controller and a row decoder in accordance with one embodiment of the invention.

Dynamic Random Access memories ("DRAMs") are commonly used in a variety of electronic devices, such as computers. A high level block diagram of a typical DRAM is shown in FIG. 1. The DRAM shown in FIG. 1 is a synchronous dynamic random access memory ("SDRAM") 10, although the principles described herein are applicable to any memory device containing memory cells that must be refreshed. The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 which stores the row address, and a row decoder 28 which applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh controller 30 that normally includes a refresh counter (not shown in FIG. 1).

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48 which applies various signals to respective sense amplifiers and associated column circuitry 50, 52 for the respective arrays 20, 22.

Data to be read from one of the arrays 20, 22 is coupled to the column circuitry 50, 52 for one of the arrays 20, 22, respectively. The data is then coupled to a data output register 56, which applies the data to a data bus 58. Data to be written to one of the arrays 20, 22 are coupled from the data bus 58 through a data input register 60 to the column circuitry 50, 52 where it is transferred to one of the arrays 20, 22, respectively. A mask register 64 may be used to selectively alter the flow of data into and out of the column circuitry 50, 52, such as by selectively masking data to be written to the arrays 20, 22.

The above-described operation of the SDRAM 10 is controlled by a command decoder 68 responsive to high level command signals received on a control bus 70. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, which the "*" designating the signal as active low. The command decoder 68 generates a sequence of command signals responsive to the high level command signals to carry out the function (e.g., a read or a write) designated by each of the high level command signals. For example, driving the RAS* and CAS* inputs low with CKE* high will cause the SDRAM 10 to enter a self refresh mode. In the self refresh mode, the refresh controller 30 causes the memory cells in the arrays 20, 22 to be periodically refreshed. These command signals, and the manner in which they accomplish their respective functions, are conventional. Therefore, in the interest of brevity, a further explanation of these control signals will be omitted.

Each of the memory arrays 20, 22 contains a large number of memory cells arranged in rows and columns, each of which stores a bit of data. In a DRAM, the memory cells are implemented with respective capacitors. However, charge gradually leaks from a memory cell capacitor, thus making it necessary to periodically recharge the capacitor, which is a procedure known as a refresh of the memory cell. Memory cells are normally refreshed by periodically activating a row of memory cells, thereby coupling each memory cell in the activated row to a respective sense amplifier. The sense amplifier senses the voltage to which each memory cell was initially charged, and then charges or discharges each memory cell to the initial voltage.

A variety of techniques have been devised to refresh the memory cells of DRAMs. In some modes, the rows of memory cells that are to be refreshed are selected by applying corresponding row addresses to the DRAM. As mentioned above, in the self-refresh mode of operation, the addresses of rows that are to be refreshed are generated by circuitry internal to the DRAM in response to receipt of the self refresh command. In all cases, the refresh is controlled by the refresh controller 30.

Figure 2:
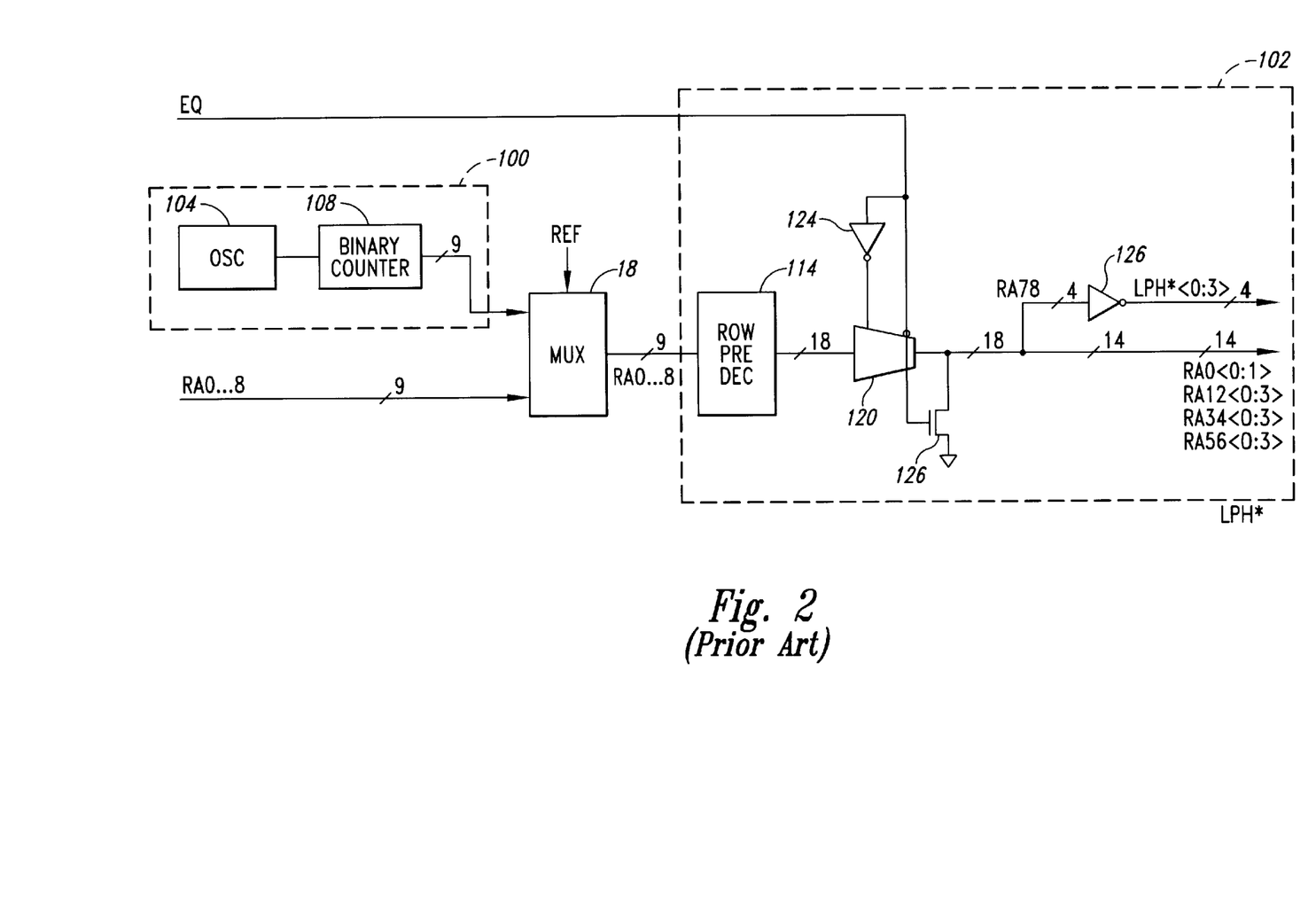
FIG. 2 is a block diagram of a portion of a conventional refresh controller and a portion of a conventional row decoder that may be used in the memory device of FIG. 2.

A block diagram of a portion of a typical prior art refresh controller 100 and a portion of a typical row address driver 102 are shown in FIG. 2. The refresh controller 100 may be used in the refresh controller 30 in the SDRAM of FIG. 1, and the row address driver 102 may be used in the row decoder 28 in the SDRAM 10 of FIG. 1. It will be understood that the refresh controller 100 and the row address driver 102 each include a large number of additional elements that have been omitted from FIG. 2 in the interest of brevity. The refresh controller 100 includes an oscillator 104 that generates a periodic signal, as is well known in the art. The periodic signal from the oscillator 104 is applied to a clock input of a binary counter 108. In the embodiment explained herein, the counter has 9 stages, and thus outputs 9 row address bits RA0–RA8 arranged from the least significant bit RA0 to the most significant bit RA8. However, it will be understood that a large or smaller number of address bits may be generated by the counter 108 depending upon the number of rows in the array. The output of the counter 108 is applied to one set of inputs to the multiplexer 18 (see, also, FIG. 1). A second set of inputs to the multiplexer 18 is coupled to the address bus 14 (FIG. 1) through the address register 12 to receive a second set of row address bits RA0–RA8. In the self-refresh mode, an REF input to the multiplexer 18 from the command decoder 68 (FIG. 1) causes the multiplexer 18 to select the row address bits RA0–RA8 from the counter 108 and apply them to the row address driver 102 (FIG. 1).

The row address driver 102 includes a row pre-decoder 114 that receives the row address bits RA0–RA8 from the multiplexer 18 and outputs pre-decoded row address signals, RA0<0:1>, RA12<0:3>, RA34<0:3>, and RA56<0:3> based on various combinations of the row addresses RA0–RA8. The row address signals RA0<0:1> consists of two signals RA<0> and RA<1> that correspond to the binary values of RA0. More specifically, when the address bit RA0 is low, RA<0> is high and RA<1> is low. When the address bit RA0 is high, RA<0> is low and RA<1> is high. The other pre-decoded row address signals are generated in a similar manner, except that two adjacent row address bits are decoded together. For example, RA34<0:3> correspond to the binary values of RA3 and RA4 as shown in Table 1 below:

TABLE 1

| RA4 | RA3 | RA34<0> | RA34<1> | RA34<2> | RA34<3> |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 1 |

The remaining pre-decoded row address signals RA12<0:3>, RA56<0:3> and RA78<0:3> are generated in the same manner.

The pre-decoded row address signals are coupled through a set of 18 pass gates 120 that are controlled by an equilibrate signal EQ and its compliment, which is generated by an inverter 124. However, it will be understood that logic gates other than the pass gates 120 may be used to selectively output the pre-decoded row address signals. The EQ signal may be generated by the command decoder 68 (FIG. 1). When the EQ signal is active high during equilibration of the arrays 20, 22, the pass gates 120 are disabled so that the pre-decoded row address signals are not coupled to the arrays 20, 22. Instead, the pre-decoded row address signals are shunted to ground by an NMOS transistor 126 being turned ON by the high EQ signal. When the EQ signal is inactive low, the transistor 126 is turned OFF and the pass gates 120 are enabled to couple the pre-decoded row address signals to the arrays 20, 22. Thus, the pre-decoded row address signals switch from inactive to active states for refresh, and then back to inactive states after each row is refreshed.

The RA78<0:3> pre-decoded row address signals are used to generate phase signals LPH*<0:3> at the output of a set of inverters 126. The LPH*<0:3> signals are thus simply the inverse of the RA78<0:3> signals, and they are active low. As explained further below, the LPH*<0:3> signals are used select one of four sets of phases of row address decoders in the arrays 20, 22.

Figure 3:
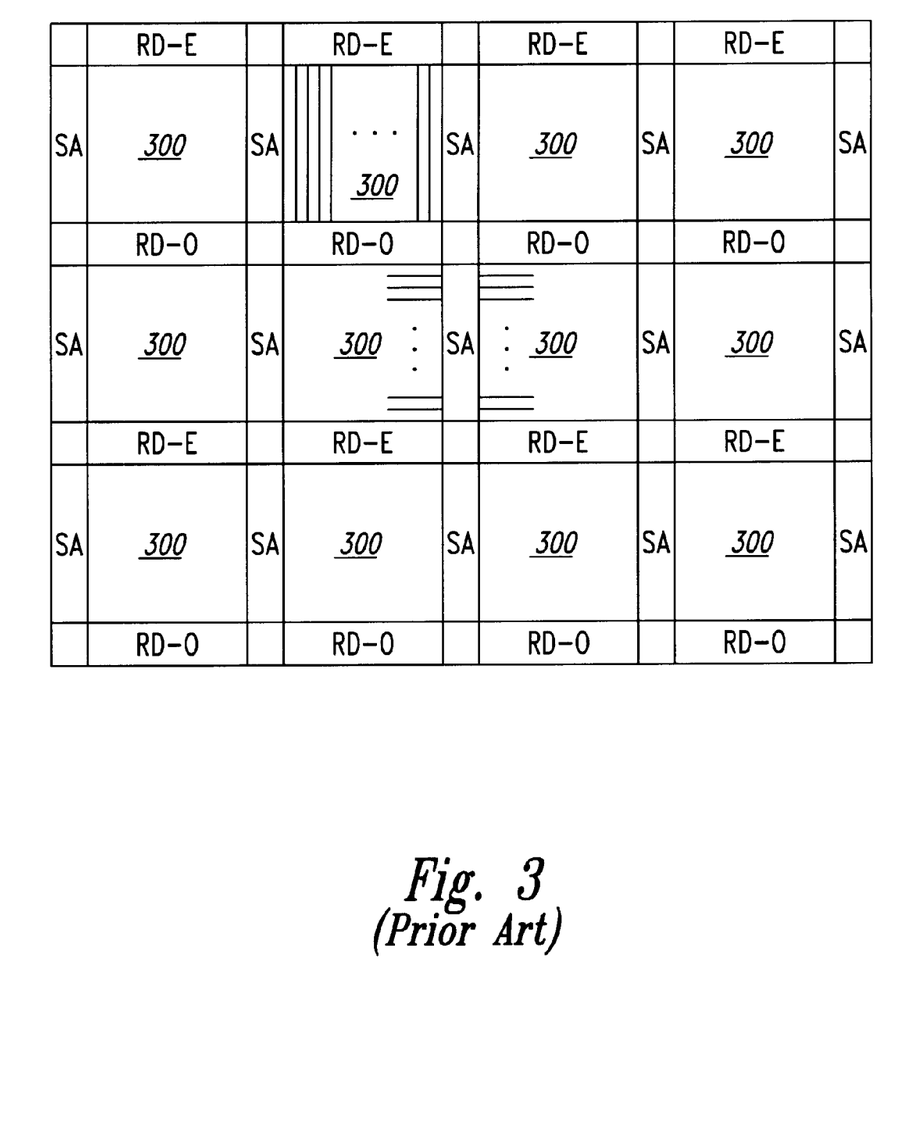
FIG. 3 is a schematic of a portion of a plurality of sub-arrays included in a memory array in the memory device of FIG. 1 showing the physical layout of sense amplifiers, row decoders, word lines and digit lines in the sub-arrays.

The topography of one of the memory arrays 20, including the routing of the phase signals LPH*<0:3> and the pre-decoded row address signals RA0<0:1> RA12<0:3>, RA34<0:3> and RA56<0:3> through the array 20, is shown in FIG. 3. The array 20 includes a plurality of sub-arrays 300, each of which is surrounded by an even set of row decoders RD-E, an odd set of row decoders RD-O, both of which are included in the row decoder 28 of FIG. 1, and two sets of sense amplifiers SA, which are included in the sense amplifiers and associated column circuitry 50, 52 of FIG. 1. As is well known in the art, even numbered word lines extend through the sub-arrays 300 from the even row decoders RD-E, odd numbered word lines extend through the sub-arrays 300 from the odd row decoders RD-O, and complimentary pairs of digit lines extend through the sub-arrays 300 from the sense amplifiers SA.

Figure 4:
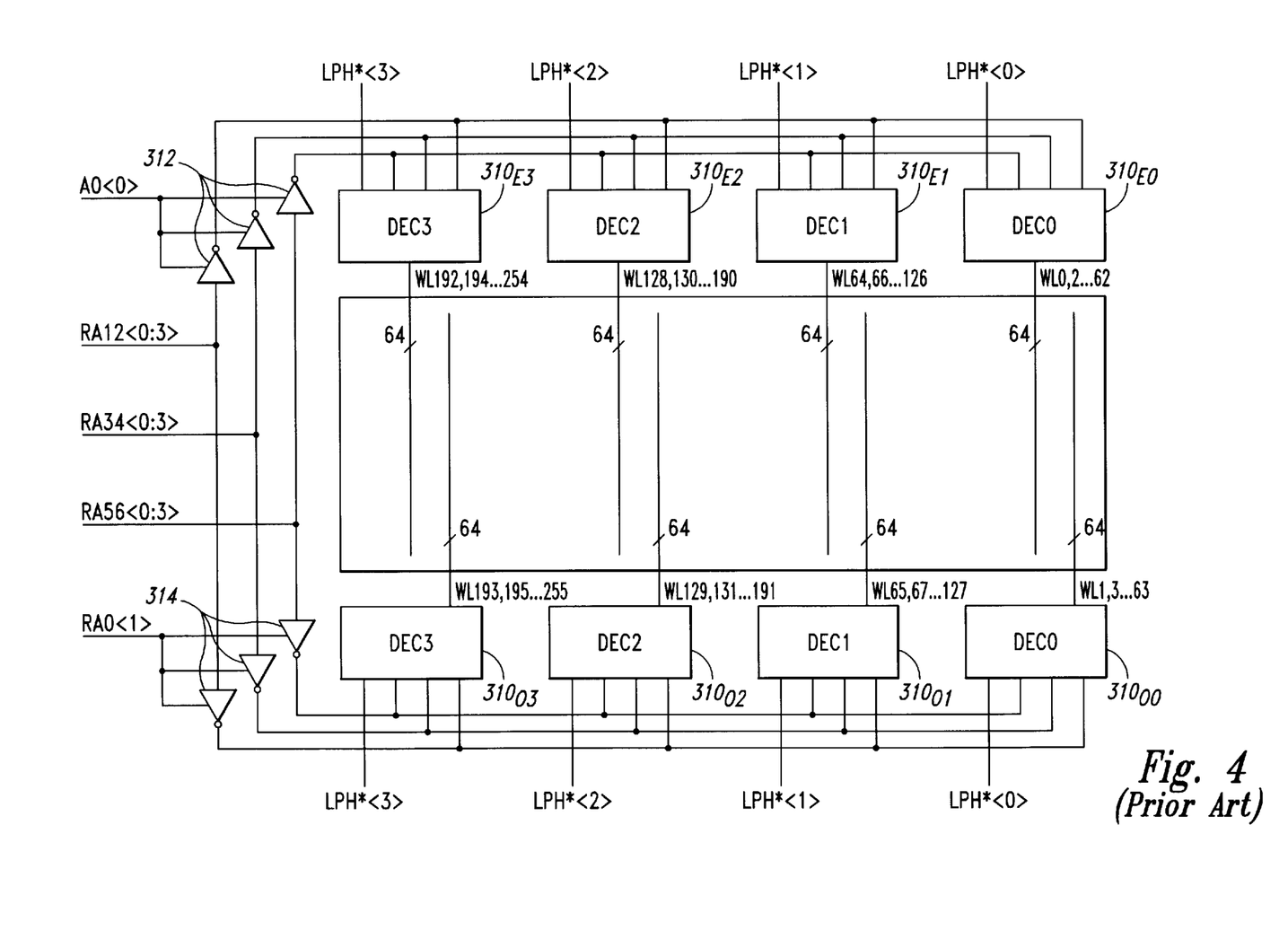
FIG. 4 is a block diagram of one of the sub-array is shown in FIG. 3 showing the manner i which row decoders are coupled to word lines in the sub-array.

A set of row decoders RD-E and RD-0 for one of the sub-arrays 300 is shown in greater detail in FIG. 4. Each even row decoder RD-E and each odd row decoder RD-O includes 4 identical decoder circuits 310 labeled DEC0-DEC3, respectively. The pre-decoded row address signals RA12<0:3>, RA34<0:3>, and RA56<0:3> are coupled to the even row decoders $310_{E0-3}$ through a first set of drivers 312 that are enabled by the even RA0 bit, RA0<0>. Similarly, pre-decoded row address signals RA12<0:3>, RA34<0:3>, and RA56<0:3> are coupled to the odd row decoders $310_{O0-3}$ through a second set of drivers 314 that are enabled by the odd RA0 bit, RA0<1>. When any of the drivers are not enabled, its output is biased low so that the row address signals RA12<0:3>, RA34<0:3>, and RA56<0:3> are all low. Thus, depending on the state of the RA0 signals, either all of the even row decoders $310_{E0-3}$ are enabled or all of the odd row decoders $310_{O0-3}$ are enabled. However, if RA0<0> and RA0<1> are both low, neither the even row decoders $310_{E0-3}$ nor the odd row decoders $310_{O0-3}$ are enabled.

Each of the decoder circuits 310 for both the even and odd word lines also receive the pre-decoded row address signals RA12<0:3>, RA34<0:3>, and RA56<0:3>. However, each of the decoder circuits 310 is enabled by a respective phase signal LPH*<0:3>. Thus, for example, the decoder circuits $310_{E2}$ and $310_{O2}$ are enabled by LPH*<2> being high. However, only the decoder circuits driving the even word lines will be enabled if RA<0> is high, and only the decoder circuits driving the odd word lines will be enabled if RA<1> is high. Thus, if LPH*<2> and RA<0> are both high, only the decoder circuit $310_{E2}$ will be enabled.

Figure 5:
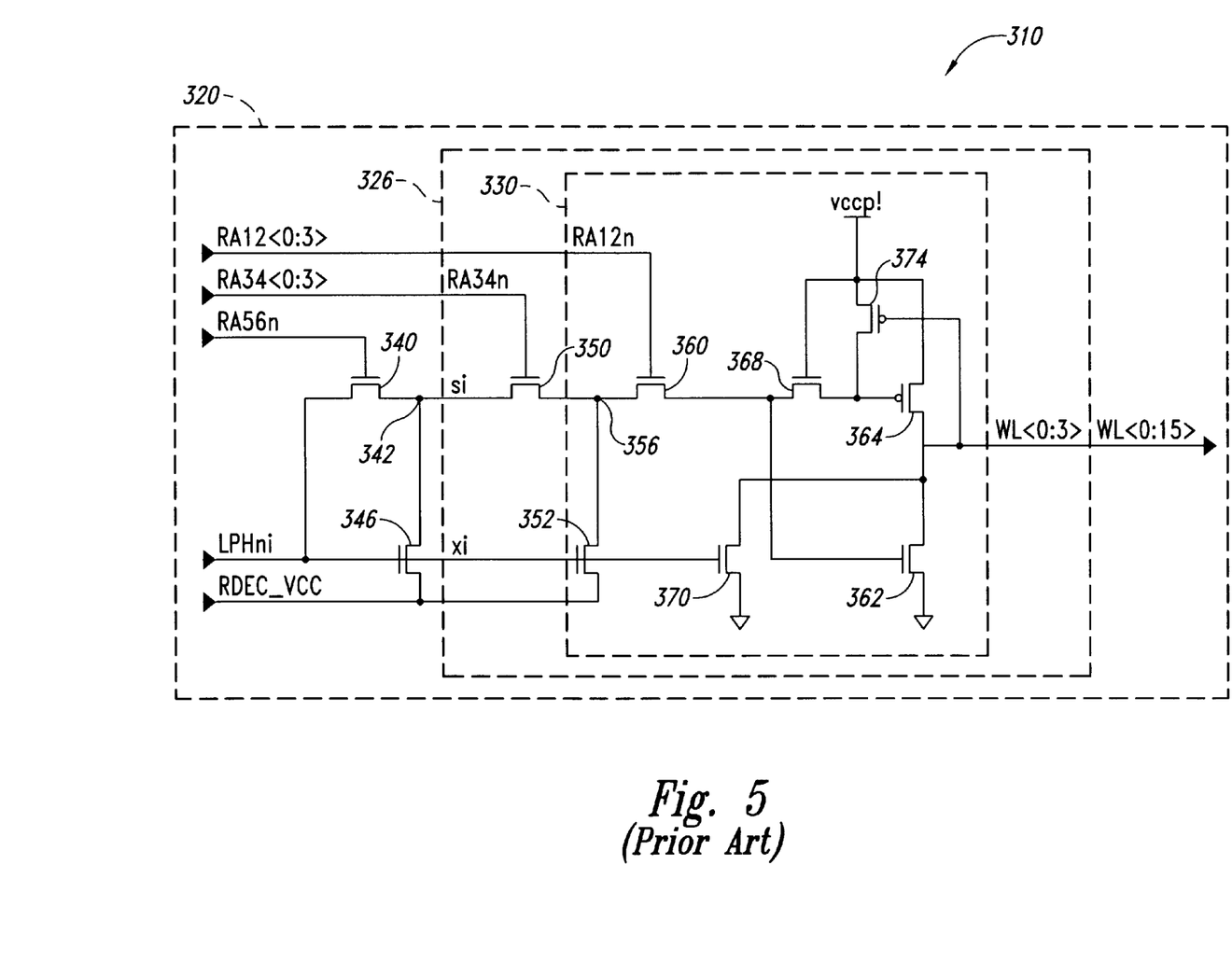
FIG. 5 is a logic diagram showing one embodiment of a row decoder used in the sub-array of FIG. 4.

One embodiment of the decoder circuit 310 is shown in FIG. 5. Each decoder circuit 310 includes 4 RA56 decoder circuits 320 (only one is shown in FIG. 5), although each of the RA56 decoder circuits 320 receives a respective one of four different RA56<0:3> signals. Similarly, each RA56 decoder circuit 320 includes 4 RA34 decoder circuits 326 (only one is shown in FIG. 5), and each RA34 decoder circuit 326 receives a respective one of four different RA34<0:3> signals. Finally, each RA34 decoder circuit 326 includes 4 RA12 decoder circuits 330 (only one is shown in FIG. 5), and each RA12 decoder circuit 330 receives a respective one of four different RA12<0:3> signals. Thus, each decoder circuit 310 includes 4 RA56 decoder circuits 320, 16 RA34 decoder circuits 326, and 64 RA12 decoder circuits 330. Each of the decoder circuits 320, 326, 330 also receive one of the phase signals LPH* to enable the decoder circuit when the received LPH* signal is active low.

Each RA56 decoder circuit 320 includes an NMOS pass transistor 340 that is enabled when the RA56 input is high. When enabled, the transistor 340 couples node 342 to the LPH* signal, which will be low when the RA56 decoder is active. The low LPH* signal also turns OFF an NMOS transistor 346. Thus, if the RA56 input is high and the LPH* input is low, the voltage at the node 342 will be low. Finally, if the LPH* input is high, the node 342 will be precharged high through the transistor 346 regardless of the state of the RA56 input.

The RA34 decoder circuit 326 includes similar structure and operates in a similar manner. More specifically, the RA34 decoder includes an NMOS pass transistor 350 and an NMOS shunting transistor, both of which are coupled to node 356. If the decoder circuit is disabled by LPH* being inactive high, the node 356 will be high. The transistor 350 couples the node 356 to the node 342 if the RA34 input is high, and isolates the node 342 from the node 342 if the RA34 input is low. Thus, if the decoder is enabled by LPH* being low and RA56 and RA34 are both high, the node 356 will be low.

The RA12 decoder 330 also includes an NMOS pass transistor 360, which is turned ON by RA12 being high. If RA12 is high, node 356 is coupled to the gate of an NMOS transistor 362 and to the gate of a PMOS transistor 364 through an NMOS transistor 368 that is biased ON by a pumped voltage Vccp. Thus, the transistors 362, 364 essentially function as an inverter that drives a word line WL.

If the decoder circuit 310 is initially inactive by LPH* being high, the word line WL is grounded through an NMOS shunting transistor 370. If LPH* subsequently transitions active low, the word line WL remains latched because the low WL voltage turns ON a PMOS transistor 374, thereby turning OFF the PMOS transistor 364 and turning ON the NMOS transistor 362 through the transistor 368. Thus, the initial condition of the decoder circuit 310 will latch the word line WL low.

If LPH* is active low, and all of the pre-decoded addresses RA56, RA34 and RA12 are all high, the low LPH* signal will be coupled through all of the pass transistors 340, 350, 360 to the gate of the PMOS transistor 364 and the gate of the NMOS transistor 362. The NMOS transistor 362 will then be turned OFF and the PMOS transistor 364 will be turned ON to drive the word line WL high. Thus, the decoder circuit 310 will drive a word line WL to which it is connected high only if the decoder circuit 310 is enabled by an active low LPH* signal and all of the pre-decoded address signals RA coupled to the decoder circuit 310 are high.

Returning to FIG. 3, it will be apparent that the signal lines carrying the re-decoded row address signals and the phase signals are relatively long since they must extend across the entire array 20. In fact, the lines carrying these signals must extend across the entire array 20 several times because they must be applied to all of the row decoders RD. It requires a significant amount of power to switch the state of a signal line because current must be provided to charge and discharge the capacitance of the line, and this current must flow through switching devices, such as MOSFET transistors (not shown), that have appreciable resistance. The amount of current needed to charge the capacitance of the lines carrying the pre-decoded row address signals and the phase signals is proportional to the length of the line. The power required to switch the signal lines carrying the row address and phase signals is relatively high because they are relatively long. Further, since the pre-decoded row address signals and the phase signals switch after each row is precharged, the self-refresh mode of conventional DRAMs requires a great deal of power. The large amount of power required reduces the operating time of battery powered computers using such DRAMs.

Therefore, there is a need for DRAMs that can operate in a self refresh mode while consuming a relatively little amount of power. It would also be desirable to do so without extensively redesigning conventional refresh controllers that cause DRAMs to consume a great deal of power in the self-refresh mode.

SUMMARY OF THE INVENTION

A method and apparatus for refreshing an array of memory cells in a dynamic random access memory is adapted to require relatively little power when operating in a self-refresh mode. In accordance with one aspect of the invention, a gray code counter is used to generate a sequence of row addresses so that only one bit of the address changes from one row address to the next row address in the sequence. Since only one bit of the row address changes each refresh cycle, only one row address line extending through the memory array must be switched each refresh cycle, thereby requiring relatively little power. In another aspect of the invention, a row pre-decoder continuously couples at least some of the row address bits to the row decoders from one refresh cycle to the next so that at least some of the row address row address lines extending through the memory array need not be switched from one refresh cycle to the next. Again, avoiding the switching of such lines minimizes the power required in the self-refresh mode of operation.

DETAILED DESCRIPTION OF THE INVENTION

Figure 6:
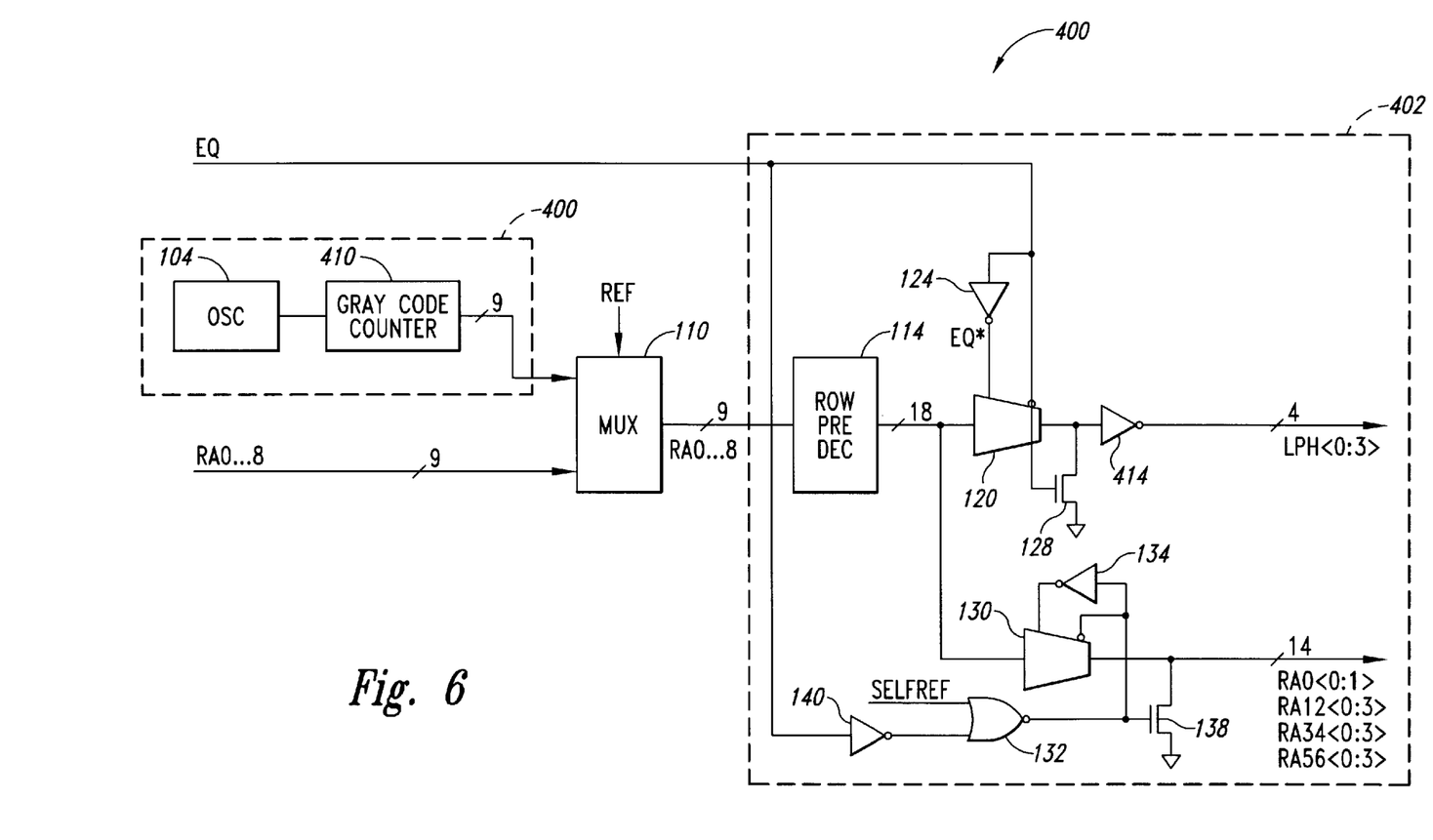
FIG. 6 is a block diagram of a portion of a refresh controller and a portion of a row decoder in accordance with one embodiment of the invention that may be used in the memory device of FIG. 1.

One embodiment of a refresh controller 400 and a row address driver 402 that can be used in the refresh controller 30 and the row decoder 28, respectively, in the SDRAM 10 of FIG. 1 is illustrated in FIG. 6. The refresh controller 400 may be identical to the refresh controller 100 of FIG. 2 except that, instead of using the binary counter 108 (FIG. 2), it uses a gray code counter 410. As is known in the art, a gray code counter, when incremented, has the property of toggling only a single output line for each count. Table 2 below shows the outputs of a binary counter along with the outputs of a 3-bit gray code counter for comparison purposes as both counters are incremented.

TABLE 2

| Binary Counter | | | | Gray Code Counter | | | |
|---|---|---|---|---|---|---|---|
| B2 | B1 | B0 | Count | B2 | B1 | B0 | Count |
| 0 | 0 | 0 | 0 | 0 | 0 | 0 | 0 |
| 0 | 0 | 1 | 1 | 0 | 0 | 1 | 1 |
| 0 | 1 | 0 | 2 | 0 | 1 | 1 | 3 |

TABLE 2-continued

| Binary Counter | | | | Gray Code Counter | | | |
|---|---|---|---|---|---|---|---|
| B2 | B1 | B0 | Count | B2 | B1 | B0 | Count |
| 0 | 1 | 1 | 3 | 0 | 1 | 0 | 2 |
| 1 | 0 | 0 | 4 | 1 | 1 | 0 | 6 |
| 1 | 0 | 1 | 5 | 1 | 1 | 1 | 7 |
| 1 | 1 | 0 | 6 | 1 | 0 | 1 | 5 |
| 1 | 1 | 1 | 7 | 1 | 0 | 0 | 4 |

As can be seen from Table 2, at various counts of the binary counter 108, multiple outputs of the counter transition. For example, at a count of 4, the outputs of the binary counter 108 transition from "011" to "100" so that all three outputs transition. In contrast, only one output of the gray code counter 410 transitions as the counter is incremented. As previously explained, the amount of power consumed during the self-refresh mode is a function of the rate at which the pre-decoded row address signals transition. By reducing the number of pre-decoded row address signals that transition with each increment of the refresh counter, the power consumed during the refresh mode can be reduced.

The row address driver 402 differs from the row address driver 102 of FIG. 2 in the treatment of the pre-decoded row address signals during equilibration.

As mentioned earlier, in the prior art row address driver 102, the pre-decoded row address signals are shunted to ground between each refresh. As a result, any bit of the pre-decoded row address signals that is a "1" will have to transition at the end of the refresh cycle, thus causing the memory device to consume a great deal of power. As explained further below, in the row address driver 402 shown in FIG. 6, only the 4 LPH*<0:3> lines, prior to being inverted by an inverter 414, are shunted to ground by the EQ signal for a refresh cycle.

The pre-decoded row address signals at the output of the row pre-decoder 114 are coupled through a pass gate 130, which is controlled by a signal from a NOR gate 132 and its compliment applied to the pass gate 130 through an inverter 134. The output of the NOR gate 132 is also applied to an NMOS transistor 138, which selectively shunts the pre-decoded row address signals from the pass gate 130 to ground. The NOR gate 132 receives an self refresh ("SELFREF"), which is active high when operating in a self refresh mode, and the compliment of the EQ signal through an inverter 140.

During operation, the NOR gate 132 shunts the pre-decoded row address signals to ground during equilibration in the normal operating mode, in which the SELFREF signal is inactive low. When the array is not being equilibrated or in the self refresh mode, the NOR gate 132 turns OFF the transistor 138, thereby continuously coupling the pre-decoded row address signals to the decoder circuits 310. As a result, once equilibration has been completed, only one pre-decoded row address signal and one of the 4 phase signals LPH*<0:3> transition. The row address driver 402 thus uses a relatively little amount of power during the self-refresh mode.

As mentioned previously, the bits from the binary counter 108 in FIG. 2 are arranged from least significant bit to most significant bit in the order RA0–RA8.

In contrast, the bits from the gray code counter 410 are preferably arranged from least significant bit to most significant bit in the order RA1–RA8, RA0, so that RA0 is the most significant bit and RA1 is the least significant bit. RA0 may thus be generated outside of the gray code count so that it only toggles after all lower address combinations have occurred. As a result, the even row decoders $310_{E0-E3}$ are first enabled to refresh the even word lines, and the odd row decoders $310_{O0-O3}$ are then enabled to refresh the odd word lines instead of alternately refreshing odd and even word lines.

Figure 7:
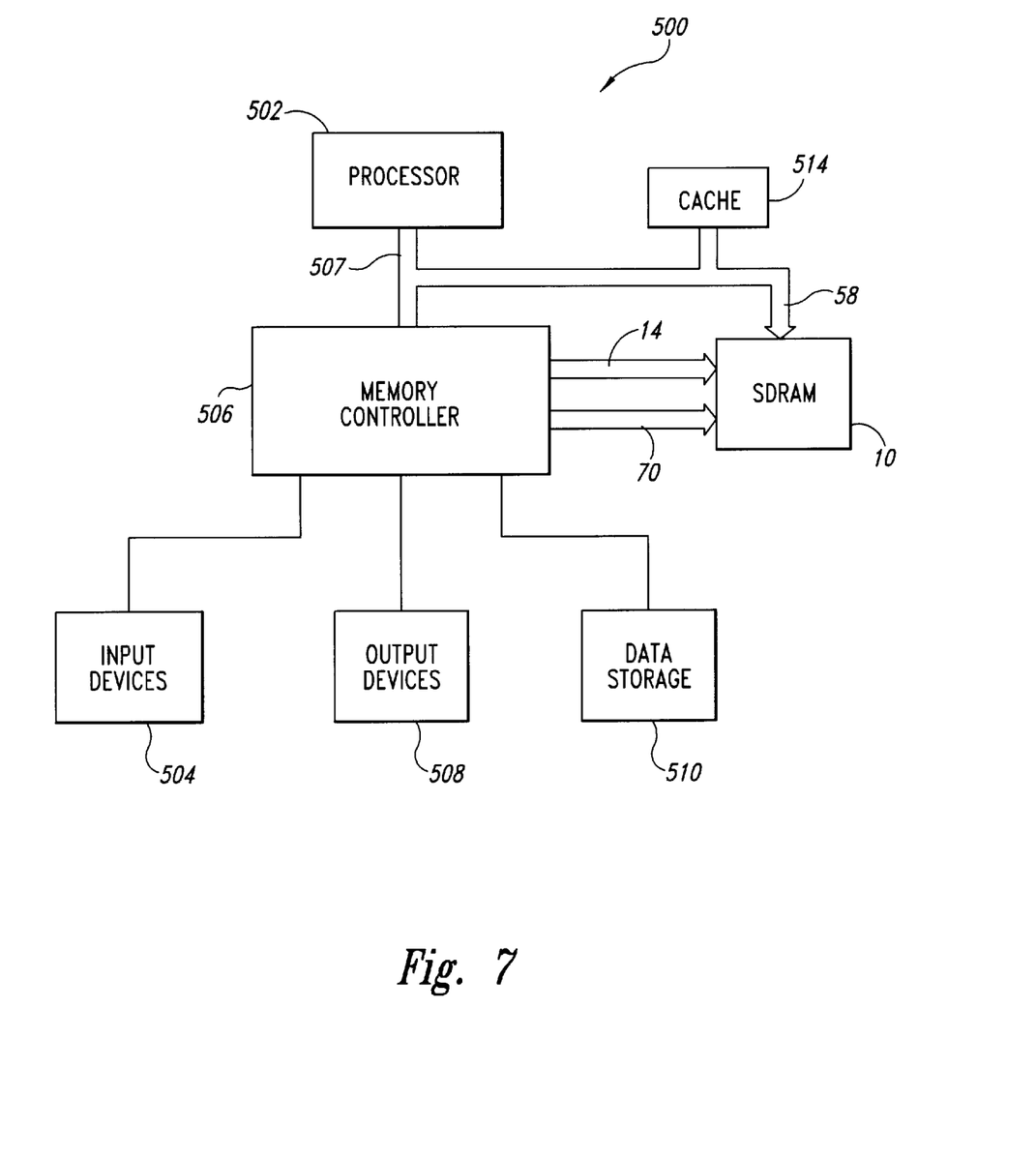
FIG. 7 is a block diagram of a computer system containing the memory device of FIG. 1 using the refresh controller and the row decoder of FIG. 6.

The refresh controller 400 and the row address driver 402 may be used in the SDRAM 10 of FIG. 1 in place of the prior art refresh controller 100 and row address driver 102, respectively, of FIG. 2. The resulting SDRAM can then be used in a computer system of the type shown in FIG. 7. With reference to FIG. 7, a computer system 500 including the SDRAM 10 containing the refresh controller 400 and row address driver 402 includes a processor 502 for performing various functions, such as performing specific calculations or tasks. In addition, the computer system 500 includes one or more input devices 504, such as a keyboard or a mouse, coupled to the processor 502 through a memory controller 506 and a processor bus 507 to allow an operator to interface with the computer system 500. Typically, the computer system 500 also includes one or more output devices 508 coupled to the processor 502, such output devices typically being a printer or a video terminal. One or more data storage devices 510 are also typically coupled to the processor 502 through the memory controller 506 to store data or retrieve data from external storage media (not shown). Examples of typical data storage devices 510 include hard and floppy disks, tape cassettes, and compact disk read-only memories (CD-ROMs). The SDRAM 10 is typically coupled to the memory controller 506 through the control bus 70 (FIG. 1) and the address bus 14. The data bus 58 of the SDRAM 10 is coupled to the processor 502 either directly (as shown) or through the memory controller 506 to allow data to be written to and read from the SDRAM 10. The computer system 500 may also include a cache memory 514 coupled to the processor 502 through the processor bus 507 to provide for the rapid storage and reading of data and/or instructions, as is well known in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A refresh controller, comprising:
   an oscillator generating a periodic signal; and
   a gray code counter having a clock input coupled to receive the periodic signal from the oscillator, the counter generating a plurality of bits corresponding to the count of the counter.

2. A row decoder, comprising:
   a pre-decoder circuit operable to generate pre-decoded row address signals;
   a logic gate coupled to some but less than all of the output terminals of the pre-decoder circuit, the logic gate being opened responsive to a control signal that is active during a predetermined phase of a refresh cycle; and
   a biasing switch coupled to an output terminal of each logic gate, each biasing switch being operable to couple the respective logic gate output terminal to a predetermined voltage responsive to the control signal being active.

3. The row decoder of claim 2 wherein the pre-decoded row address signals comprise a plurality of pre-decoded address bits adapted to be decoded by a plurality of row decoder circuits and a plurality of phase bits adapted to enable respective ones of the plurality of decoder circuits, and wherein the logic gates are coupled to output terminals of the pre-decoder circuit on which the phase bits are generated.

4. The row decoder of claim 3 further comprising:
a respective address bit logic gate coupled to each output terminal of the pre-decoder circuit generating each of the pre-decoded address bits, the address bit logic gates being opened responsive to a second control signal that is active during a second predetermined phase of a refresh cycle; and
a respective biasing switch coupled to an output terminal of each address bit logic gate, each biasing switch being operable to couple the respective address bit logic gate output terminal to a predetermined voltage responsive to the second control signal being active.

5. The row decoder of claim 4 wherein the second control signal is generated by a logic circuit that generates the active second control signal during equilibration while in a normal operation mode, and generates an inactive second control signal either after equilibration or while in a self refresh mode.

6. The row decoder of claim 2, wherein each of the logic gates comprises a respective pass gate.

7. A dynamic random access memory, comprising:
an array of memory cells divided into a plurality of sub-arrays, the memory cells in each of the sub-arrays being arranged in rows and columns;
an oscillator generating a periodic signal;
a gray code counter having a clock input coupled to receive the periodic signal from the oscillator, the counter generating a plurality of bits corresponding to the count of the counter;
a plurality of row decoders located within the memory sub-arrays, each of the row decoders being operable to decode pre-decoded row address signals and activate corresponding word lines of the sub-array;
a row address pre-decoder coupled to receive the bits from the counter; the row address pre-decoder generating at respective output terminals the pre-decoded row address signals corresponding to respective combinations of the bits from the counter, the pre-decoded row address being coupled through respective signal lines to the row decoders;
a column address decoder coupled to receive column address signal and to enable respective columns of memory cells in each sub-array;
a data path coupled between the memory array and a data bus; and
a command decoder operable to receive memory commands from a command bus and to generate control signals corresponding to respective memory commands.

8. The dynamic random access memory of claim 7 further comprising:
a logic gate coupled to some but less than all of the output terminals of the row address pre-decoder, the logic gate being opened responsive to a control signal that is active during a predetermined phase of a refresh cycle; and
a biasing switch coupled to an output terminal of each logic gate, each biasing switch being operable to couple the respective logic gate output terminal to a predetermined voltage responsive to the control signal being active.

9. The dynamic random access memory of claim 8 wherein the pre-decoded row address signals comprise a plurality of pre-decoded address bits adapted to be decoded by the row decoders and a plurality of phase bits adapted to enable respective ones of the row decoders, and wherein the logic gates are coupled to output terminals of the row address pre-decoder on which the phase bits are generated.

10. The dynamic random access memory of claim 9 further comprising:
a respective address bit logic gate coupled to each output terminal of the pre-decoder circuit generating each of the pre-decoded address bits, the address bit logic gates being opened responsive to a second control signal that is active during a second predetermined phase of a refresh cycle; and
a respective biasing switch coupled to an output terminal of each address bit logic gate, each biasing switch being operable to couple the respective address bit logic gate output terminal to a predetermined voltage responsive to the second control signal being active.

11. The dynamic random access memory of claim 10 wherein the second control signal is generated by a logic circuit that generates the active second control signal during equilibration while in a normal operation mode, and generates an inactive second control signal either after equilibration or while in a self refresh mode.

12. The dynamic random access memory of claim 8, wherein each of the logic gates comprises a respective pass gate.

13. The dynamic random access memory of claim 7 wherein each of the sub-arrays includes a plurality of even-numbered word lines, a plurality of odd-numbered word lines each driven by respective first and second sets of the row decoders, and wherein the dynamic random access memory further comprises a driver circuit coupling a respective one of each of the pre-decoded row address signals to the row decoders, each of the driver circuits coupling a pre-decoded row address signal to one of the row decoders in the first set being enabled by a first one of the pre-decoded row address signals, and each of the driver circuits coupling a pre-decoded row address signal to one of the row decoders in the second set being enabled by a second one of the pre-decoded row address signals.

14. The dynamic random access memory of claim 13 wherein the pre-decoded row address signals enabling the driver circuits comprises signals decoded from a high order bit outside the gray code counter.

15. A dynamic random access memory, comprising:
an array of memory cells divided into a plurality of sub-arrays, the memory cells in each of the sub-arrays being arranged in rows and columns;
an oscillator generating a periodic signal;
a counter having a clock input coupled to receive the periodic signal from the oscillator, the counter generating a plurality of bits corresponding to the count of the counter;
a pre-decoder circuit coupled to receive the bits from the counter and being operable to decode the bits from the counter and generate corresponding pre-decoded row address signals;
a logic gate coupled to some but less than all of the output terminals of the pre-decoder circuit, the logic gate being opened responsive to a control signal that is active during a predetermined phase of a refresh cycle;
a biasing switch coupled to an output terminal of each logic gate, each biasing switch being operable to couple the respective logic gate output terminal to a predetermined voltage responsive to the control signal being active;

a plurality of row decoders located within the memory sub-arrays, each of the row decoders being coupled to receive the pre-decoded row address signals from the pre-decoder circuit and each logic gate, the row decoders being operable to decode the pre-decoded row address signals and activate corresponding word lines of the sub-array;

a column address decoder coupled to receive column address signal and to enable respective columns of memory cells in each sub-array;

a data path coupled between the memory array and a data bus; and a command decoder operable to receive memory commands from a command bus and to generate control signals corresponding to respective memory commands.

16. The dynamic random access memory of claim 15 wherein the pre-decoded row address signals comprise a plurality of pre-decoded address bits adapted to be decoded by the row decoders and a plurality of phase bits adapted to enable respective ones of the row decoders, and wherein the logic gates are coupled to output terminals of the row address pre-decoder on which the phase bits are generated.

17. The dynamic random access memory of claim 16 further comprising:

a respective address bit logic gate coupled to each output terminal of the pre-decoder circuit generating each of the pre-decoded address bits, the address bit logic gates being opened responsive to a second control signal that is active during a second predetermined phase of a refresh cycle; and a respective biasing switch coupled to an output terminal of each address bit logic gate, each biasing switch being operable to couple the respective address bit logic gate output terminal to a predetermined voltage responsive to the second control signal being active.

18. The dynamic random access memory of claim 17 wherein the second control signal is generated by a logic circuit that generates the active second control signal during equilibration while in a normal operation mode, and generates an inactive second control signal either after equilibration or while in a self refresh mode.

19. The dynamic random access memory of claim 15 wherein each of the sub-arrays includes a plurality of even-numbered word lines, a plurality of odd-numbered word lines each driven by respective first and second sets of the row decoders, and wherein the dynamic random access memory further comprises a driver circuit coupling a respective one of each of the pre-decoded row address signals to the row decoders, each of the driver circuits coupling a pre-decoded row address signal to one of the row decoders in the first set being enabled by a first one of the pre-decoded row address signals, and each of the driver circuits coupling a pre-decoded row address signal to one of the row decoders in the second set being enabled by a second one of the pre-decoded row address signals.

20. The dynamic random access memory of claim 19 wherein the pre-decoded row address signals enabling the driver circuits comprises signals decoded from a high order bit outside the gray code counter.

21. The dynamic random access memory of claim 15 wherein the counter comprise a gray code counter.

22. The dynamic random access memory of claim 15, wherein each of the logic gates comprises a respective pass gate.

23. A computer system, comprising:

computer circuitry operable to perform computing functions;

at least one input device coupled to the computer circuitry;

at least one output device coupled to the computer circuitry;

at least one data storage devices coupled to the computer circuitry; and a dynamic random access memory, comprising an array of memory cells divided into a plurality of sub-arrays, the memory cells in each of the sub-arrays being arranged in rows and columns;

an oscillator generating a periodic signal;

a gray code counter having a clock input coupled to receive the periodic signal from the oscillator, the counter generating a plurality of bits corresponding to the count of the counter;

a plurality of row decoders located within the memory sub-arrays, each of the row decoders being operable to decode pre-decoded row address signals and activate corresponding word lines of the sub-array;

a row address pre-decoder coupled to receive the bits from the counter; the row address pre-decoder generating at respective output terminals the pre-decoded row address signals corresponding to respective combinations of the bits from the counter, the pre-decoded row address being coupled through respective signal lines to the row decoders;

a column address decoder coupled to receive column address signal and to enable respective columns of memory cells in each sub-array;

a data path coupled between the memory array and a data bus; and a command decoder operable to receive memory commands from a command bus and to generate control signals corresponding to respective memory commands.

24. The computer system of claim 23 further comprising:

a logic gate coupled to some but less than all of the output terminals of the row address pre-decoder, the logic gate being opened responsive to a control signal that is active during a predetermined phase of a refresh cycle; and a biasing switch coupled to an output terminal of each logic gate, each biasing switch being operable to couple the respective logic gate output terminal to a predetermined voltage responsive to the control signal being active.

25. The computer system of claim 24 wherein the pre-decoded row address signals comprise a plurality of pre-decoded address bits adapted to be decoded by the row decoders and a plurality of phase bits adapted to enable respective ones of the row decoders, and wherein the logic gates are coupled to output terminals of the row address pre-decoder on which the phase bits are generated.

26. The computer system of claim 25 further comprising:

a respective address bit logic gate coupled to each output terminal of the pre-decoder circuit generating each of the pre-decoded address bits, the address bit logic gates being opened responsive to a second control signal that is active during a second predetermined phase of a refresh cycle; and a respective biasing switch coupled to an output terminal of each address bit logic gate, each biasing switch being operable to couple the respective address bit logic gate output terminal to a predetermined voltage responsive to the second control signal being active.

27. The computer system of claim 26 wherein the second control signal is generated by a logic circuit that generates the active second control signal during equilibration while in a normal operation mode, and generates an inactive second control signal either after equilibration or while in a self refresh mode.

28. The computer system of claim 24, wherein each of the logic gates comprises a respective pass gate.

29. The computer system of claim 23 wherein each of the sub-arrays includes a plurality of even-numbered word lines, a plurality of odd-numbered word lines each driven by respective first and second sets of the row decoders, and wherein the dynamic random access memory further comprises a driver circuit coupling a respective one of each of the pre-decoded row address signals to the row decoders, each of the driver circuits coupling a pre-decoded row address signal to one of the row decoders in the first set being enabled by a first one of the pre-decoded row address signals, and each of the driver circuits coupling a pre-decoded row address signal to one of the row decoders in the second set being enabled by a second one of the pre-decoded row address signals.

30. The computer system of claim 29 wherein the pre-decoded row address signals enabling the driver circuits comprises signals decoded from a high order bit outside the gray code counter.

31. A computer system, comprising:
   computer circuitry operable to perform computing functions;
   at least one input device coupled to the computer circuitry;
   at least one output device coupled to the computer circuitry;
   at least one data storage devices coupled to the computer circuitry; and
   a dynamic random access memory, comprising
      an array of memory cells divided into a plurality of sub-arrays, the memory cells in each of the sub-arrays being arranged in rows and columns;
      an oscillator generating a periodic signal;
      a counter having a clock input coupled to receive the periodic signal from the oscillator, the counter generating a plurality of bits corresponding to the count of the counter;
      a pre-decoder circuit coupled to receive the bits from the counter and being operable to decode the bits from the counter and generate corresponding pre-decoded row address signals;
      a logic gate coupled to some but less than all of the output terminals of the pre-decoder circuit, the logic gate being opened responsive to a control signal that is active during a predetermined phase of a refresh cycle;
      a biasing switch coupled to an output terminal of each logic gate, each biasing switch being operable to couple the respective logic gate output terminal to a predetermined voltage responsive to the control signal being active;
      a plurality of row decoders located within the memory sub-arrays, each of the row decoders being coupled to receive the pre-decoded row address signals from the pre-decoder circuit and each logic gate, the row decoders being operable to decode the pre-decoded row address signals and activate corresponding word lines of the sub-array;
      a column address decoder coupled to receive column address signal and to enable respective columns of memory cells in each sub-array;
      a data path coupled between the memory array and a data bus; and
      a command decoder operable to receive memory commands from a command bus and to generate control signals corresponding to respective memory commands.

32. The computer system of claim 31 wherein the pre-decoded row address signals comprise a plurality of pre-decoded address bits adapted to be decoded by the row decoders and a plurality of phase bits adapted to enable respective ones of the row decoders, and wherein the logic gates are coupled to output terminals of the row address pre-decoder on which the phase bits are generated.

33. The computer system of claim 32 further comprising:
   a respective address bit logic gate coupled to each output terminal of the pre-decoder circuit generating each of the pre-decoded address bits, the address bit logic gates being opened responsive to a second control signal that is active during a second predetermined phase of a refresh cycle; and
   a respective biasing switch coupled to an output terminal of each address bit logic gate, each biasing switch being operable to couple the respective address bit logic gate output terminal to a predetermined voltage responsive to the second control signal being active.

34. The computer system of claim 33 wherein the second control signal is generated by a logic circuit that generates the active second control signal during equilibration while in a normal operation mode, and generates an inactive second control signal either after equilibration or while in a self refresh mode.

35. The computer system of claim 31, wherein each of the logic gates comprises a respective pass gate.

36. The computer system of claim 31 wherein each of the sub-arrays includes a plurality of even-numbered word lines, a plurality of odd-numbered word lines each driven by respective first and second sets of the row decoders, and wherein the dynamic random access memory further comprises a driver circuit coupling a respective one of each of the pre-decoded row address signals to the row decoders, each of the driver circuits coupling a pre-decoded row address signal to one of the row decoders in the first set being enabled by a first one of the pre-decoded row address signals, and each of the driver circuits coupling a pre-decoded row address signal to one of the row decoders in the second set being enabled by a second one of the pre-decoded row address signals.

37. The computer system of claim 36 wherein the pre-decoded row address signals enabling the driver circuits comprises signals decoded from a high order bit outside the gray code counter.

38. The computer system of claim 36 wherein the counter comprise a gray code counter.

39. A method of refreshing an array of memory cells in a dynamic random access memory, the method comprising:
   generating combinations of active row address bits, the combinations being generated in a sequence in which only one bit in each combination changes from one combination in the sequence to the next; and
   coupling the active row address bits to row decoders located in the array of memory cells.

40. The method of claim 39 wherein the act of coupling the active row address bits to row decoders located in the array of memory cells comprises continuously coupling at least some of the active row address bits to the row decoders from one refresh cycle to the next.

41. The method of claim 39 wherein the act of generating combinations of active row address bits comprises:

generating a periodic signal; and generating a plurality of gray code bits responsive to each cycle of the periodic signal.

42. The method of claim 41 wherein the act of generating a plurality of gray code bits responsive to each cycle of the periodic signal comprises:

counting each cycle of the periodic signal; and generating a plurality of the gray code bits corresponding to respective counts of the cycles of the periodic signal.

43. A method of refreshing an array of memory cells in a dynamic random access memory, the method comprising:

generating combinations of row address bits, and continuously coupling at least some of the row address bits to the row decoders from one refresh cycle to the next.

44. The method of claim 43 wherein the act of generating combinations of row address bits comprises:

generating a periodic signal; and generating a plurality of gray code bits responsive to each cycle of the periodic signal.

45. The method of claim 44 wherein the act of generating a plurality of gray code bits responsive to each cycle of the periodic signal comprises:

counting each cycle of the periodic signal; and generating a plurality of the gray code bits corresponding to respective counts of the cycles of the periodic signal.

46. The method of claim 43, further comprising continuously coupling at least some of the row address bits to a bias voltage during a predetermined portion of a refresh cycle.

47. In a dynamic random access memory having an array of memory cells divided into a plurality of sub-arrays, a method of refreshing the memory cells comprising:

generating pre-decoded row address signals corresponding to incrementing gray code bits;

decoding the pre-decoded row address signals; and activating word lines of the sub-array corresponding to the decoded pre-decoded row address signals.

48. The method of claim 47 wherein the act of activating word lines of the sub-array corresponding to the decoded pre-decoded row address signals comprises activating all of the word lines in one of the sub-arrays before activating the word lines in another of the sub-arrays.

49. The method of claim 47 wherein each of the sub-arrays includes a plurality of even-numbered word lines and a plurality of odd-numbered word lines, and wherein the act of activating word lines of the sub-arrays comprises activating all of the even-numbered word lines word lines in each sub-array before activating the odd-numbered word lines word lines in the sub-array.

50. The method of claim 47 wherein the act of generating pre-decoded row address signals corresponding to incrementing gray code bits comprises:

generating a periodic signal; and generating a plurality of gray code bits responsive to each cycle of the periodic signal.

51. The method of claim 50 wherein the act of generating a plurality of gray code bits responsive to each cycle of the periodic signal comprises:

counting each cycle of the periodic signal; and generating a plurality of the gray code bits corresponding to respective counts of the cycles of the periodic signal.

* * * * *